(12) United States Patent
Yen

(10) Patent No.: US 10,686,425 B2
(45) Date of Patent: Jun. 16, 2020

(54) BULK ACOUSTIC WAVE RESONATORS HAVING CONVEX SURFACES, AND METHODS OF FORMING THE SAME

(71) Applicant: Texas Instruments Incorporated, Dallas, TX (US)

(72) Inventor: Ting-Ta Yen, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 328 days.

(21) Appl. No.: 15/639,552

(22) Filed: Jun. 30, 2017

(65) Prior Publication Data

US 2019/0007020 A1   Jan. 3, 2019

(51) Int. Cl.
| | | |
|---|---|---|
| *H01L 41/09* | (2006.01) | |
| *H03H 9/02* | (2006.01) | |
| *H03H 3/02* | (2006.01) | |
| *H03H 9/17* | (2006.01) | |

(52) U.S. Cl.
CPC ............ *H03H 9/0211* (2013.01); *H03H 3/02* (2013.01); *H03H 9/02015* (2013.01); *H03H 9/02157* (2013.01); *H03H 9/02047* (2013.01); *H03H 9/172* (2013.01); *H03H 2003/021* (2013.01); *H03H 2003/025* (2013.01)

(58) Field of Classification Search
CPC .... H03H 9/0211; H03H 3/02; H03H 9/02015; H03H 9/02157; H03H 9/02047; H03H 9/172; H03H 2003/021; H03H 2003/025
USPC .......................... 310/367–369, 348, 365, 371
See application file for complete search history.

(56) References Cited

U.S. PATENT DOCUMENTS

| | | | |
|---|---|---|---|
| 3,988,703 A | | 10/1976 | DeVries |
| 4,188,557 A | * | 2/1980 | Mattuschka ............. H03H 9/19 310/368 |
| 4,193,473 A | | 3/1980 | Hartemann |
| 4,985,655 A | * | 1/1991 | Jensik .................. H03H 9/0514 310/344 |
| 5,747,857 A | | 5/1998 | Eda et al. |
| 5,767,612 A | * | 6/1998 | Takeuchi ............ H01L 41/0973 310/324 |
| 6,049,158 A | * | 4/2000 | Takeuchi ................. B41J 2/161 310/324 |
| 6,087,198 A | | 7/2000 | Panasik |
| 6,094,294 A | * | 7/2000 | Yokoyama ......... G02B 26/0858 359/290 |
| 6,548,942 B1 | | 4/2003 | Panasik |
| 6,842,088 B2 | | 1/2005 | Yamakawa et al. |

(Continued)

OTHER PUBLICATIONS

International Search Report for PCT/US2018/043612 dated Oct. 18, 2018.

(Continued)

*Primary Examiner* — Thomas M Dougherty
(74) *Attorney, Agent, or Firm* — Michael A. Davis, Jr.; Charles A. Brill; Frank D. Cimino

(57) ABSTRACT

Bulk acoustic wave (BAW) resonators having convex surfaces, and methods of forming the same are disclosed. An example BAW resonator includes a first electrode, a piezoelectric layer formed on the first electrode, the piezoelectric layer having a convex surface, and a second electrode formed on the convex surface. An example integrated circuit (IC) package includes a BAW resonator disposed in the IC package, the BAW resonator including a piezoelectric layer having a convex surface.

13 Claims, 3 Drawing Sheets

(56) References Cited

U.S. PATENT DOCUMENTS

| | | | |
|---|---|---|---|
| 7,067,964 B1* | 6/2006 | Kosinski | H03H 9/09 |
| | | | 310/348 |
| 7,418,772 B2 | 9/2008 | Nishiyama et al. | |
| 7,621,624 B2 | 11/2009 | Pan et al. | |
| 7,675,389 B2 | 3/2010 | Yamakawa et al. | |
| 7,714,684 B2 | 5/2010 | Ruby et al. | |
| 7,786,826 B2 | 8/2010 | Thalhammer et al. | |
| 7,812,502 B2* | 10/2010 | Zalalutdinov | G02B 26/0858 |
| | | | 310/306 |
| 7,893,597 B2 | 2/2011 | Nishimura et al. | |
| 7,939,987 B1 | 5/2011 | Solal et al. | |
| 8,215,171 B1* | 7/2012 | Smith | G01N 29/022 |
| | | | 310/313 R |
| 8,456,257 B1 | 6/2013 | Fattinger | |
| 8,941,286 B2* | 1/2015 | Taniguchi | H03H 9/02102 |
| | | | 310/320 |
| 9,232,289 B2 | 1/2016 | Bahr et al. | |
| 9,577,603 B2 | 2/2017 | Burak et al. | |
| 9,663,346 B1 | 5/2017 | Bahr et al. | |
| 9,673,376 B1 | 6/2017 | Krivokapic et al. | |
| 9,876,483 B2* | 1/2018 | Ortiz | H01L 41/053 |
| 2004/0070313 A1 | 4/2004 | Furukawa et al. | |
| 2005/0093656 A1 | 5/2005 | Larson, III et al. | |
| 2006/0255696 A1* | 11/2006 | Sato | H03H 3/02 |
| | | | 310/369 |
| 2009/0295505 A1 | 12/2009 | Mohammadi et al. | |
| 2012/0086523 A1 | 4/2012 | Meltaus et al. | |
| 2013/0214879 A1 | 8/2013 | Gorisse et al. | |
| 2014/0225684 A1 | 8/2014 | Kando et al. | |
| 2014/0273881 A1 | 9/2014 | Tajic | |
| 2018/0205362 A1 | 7/2018 | Kishimoto et al. | |

OTHER PUBLICATIONS

Bahr et al., "Theory and Design of Phononic Crystals for Unreleased CMOS-MEMS Resonant Body Transistors," Journal of Microelectromechanical Systems, vol. 24, No. 5, Oct. 2015, 14 pages.

Bahr, "Monolithically Integrated MEMS Resonators and Oscillators in Standard IC Technology," Doctoral Thesis, Massachusetts Institute of Technology, May 18, 2016, 255 pages.

Bahr et al., "Vertical Acoustic Confinement for High-Q Fully-Differential CMOS-RBTS," Solid-State Sensors, Actuators and Microsystems Workshop, Hilton Head), 2016, 4 pages.

Bahr et al, "Optimization of Unreleased CMOS-MEMS RBTs," Frequency Control Symposium (IFCS), 2016 IEEE International, 4 pages.

Wang et al., "Tapered Phononic Crystal Saw Resonator in GAN," MEMS 2015, Estoril, Portugal, Jan. 18-22, IEEE, 4 pages.

Wang et al., "Resonant Body Transistors in Standard CMOS Technology," Oct. 2012, 7 pages.

Gorishnyy et al., "Sound ideas," Physics World, Dec. 2005, 6 pages.

Lin et al., "Quality Factor Enhancement in Lamb Wave Resonators Utilizing Aln Plates with Convex Edges," IEEE, Trasducers '11, Beijing, China, Jun. 5-9, 2011, 4 pages.

C.J. Wilson, "Vibration modes of AT-cut convex quartz resonators," J. Phys. D: Appl. Phys., vol. 7, 1974, 7 pages.

Adachi et al., "Investigation of Spurious Modes of Convex DT-Cut Quartz Crystal Resonators," Proc. 35th Annual Freq Control Symposium, USAERADCOM, Ft. Monmouth, NJ, May 1981, 8 pages.

\* cited by examiner

US 10,686,425 B2

BULK ACOUSTIC WAVE RESONATORS HAVING CONVEX SURFACES, AND METHODS OF FORMING THE SAME

FIELD OF THE DISCLOSURE

This disclosure relates generally to bulk acoustic wave (BAW) resonators, and, more particularly, to BAW resonators having convex surfaces, and methods of forming the same.

BACKGROUND

In BAW resonators, electrodes (e.g., contacts, metal patches, etc.) on top and bottom surfaces of a piezoelectric layer provide voltage bias to excite acoustic waves through piezoelectric (and reverse piezoelectric) effect. The bulk acoustic waves of specific frequencies are generated within the resonant cavity between the top and bottom surfaces of the piezoelectric layer to form a resonance response.

SUMMARY

BAW resonators having convex surfaces, and methods of forming the same are disclosed. An example BAW resonator includes a first (e.g., a bottom) electrode, a piezoelectric layer formed on the first electrode, the piezoelectric layer having a convex surface, and a second (e.g., a bottom) electrode formed on the convex surface. An example integrated circuit (IC) package includes a BAW resonator disposed in the IC package, the BAW resonator including a piezoelectric layer having a convex surface. In some examples, the BAW resonator is integrated with an IC die in the IC package.

Figure 1:
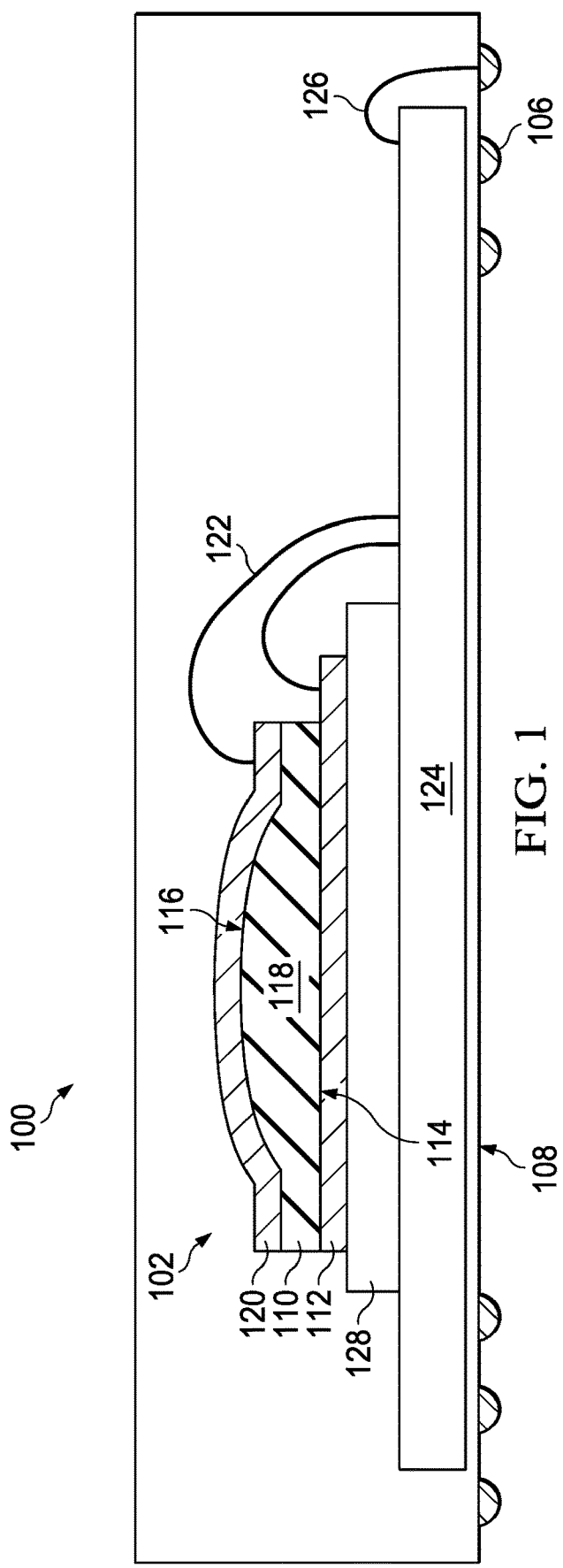
FIG. 1 is a side cross-section view of an example integrated circuit (IC) package including an example BAW resonator having an example convex surface, constructed according to this disclosure.

The figures are not to scale. Instead, to clarify multiple layers and regions, the thickness of the layers may be enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, indicates that the referenced part is either in contact with the other part, or that the referenced part is above the other part with one or more intermediate part(s) located therebetween. Stating that any part is in contact with another part means that there is no intermediate part between the two parts. Use of terms such as up, down, top, bottom, side, end, front, back, etc. herein are used with reference to a currently considered or illustrated orientation. If a different orientation is considered, such terms must be correspondingly modified. Connecting lines or connectors shown in the various figures presented are intended to represent example functional relationships and/or physical or logical couplings between the various elements.

DETAILED DESCRIPTION

Reference will now be made in detail to non-limiting examples of this disclosure, examples of which are illustrated in the accompanying drawings. The examples are described below by referring to the drawings.

The performance of devices, such as modern wireless communication devices, depends heavily on the accuracy and noise level of the clock signals used in a system. Such systems necessarily need high-frequency, and high quality factor (Q) resonators. Q is a dimensionless parameter that reflects the under-damping of an oscillator, and characterizes a resonator's bandwidth relative to its center frequency. The Q of known BAW resonators are 10 to 100 times lower than the intrinsic limitations of the piezoelectric material. To improve the performance of BAW resonators, example BAW resonators including a piezoelectric layer having a convex surface are disclosed herein. The example convex surface of a piezoelectric layer retains more acoustic energy in the active area of the BAW resonator, thereby increasing the Q of the BAW resonator (e.g., by a factor or two or higher), and, in turn, the performance of a system. As will be described, the example piezoelectric layers having a convex surface disclosed herein can be formed using processing steps compatible with complementary metal-oxide semiconductor (CMOS) manufacturing processes. For instance, convex surfaces of piezoelectric materials can be form using gray-scale lithography, shaped lithography, sloped lithography, etc.

FIG. 1 is a side cross-section view of an example IC package 100 having an example BAW resonator 102 disposed in the example IC package 100. The example IC package 100 of FIG. 1 is a surface mount device with a plurality of contacts (an example of which is designated at reference numeral 106) on a bottom side 108. However, the example IC package 100 may be of any type, and may have any form, material(s), shape, dimension(s), number of contacts, shape of contacts, etc. Moreover, the BAW resonator 102 and/or any other components may be packaged, mounted, etc. in the IC package 100 in any way. The example IC package 100 may be, for example, a semiconductor-based device. In some examples, the IC package 100 is a wafer-level package, or a die-level package.

The example BAW resonator 102 of FIG. 1 includes a piezoelectric layer 110 disposed on (e.g., deposited on, formed on, etc.) an example electrode 112. In the illustrated example of FIG. 1, at least a portion of a bottom surface 114 of the piezoelectric layer 110 that is in contact with the electrode 112 is a planar surface, and the electrode 112 is a planar structure. However, the bottom surface 114 and the electrode 112 may be formed to have other shapes. For example, they may also have convex shapes. In the case of a semiconductor-based IC package, the example piezoelectric layer 110 may include a piezoelectric material compatible with a CMOS manufacturing process, such as aluminum nitride, zinc oxide, etc. In some examples, the BAW resonator 102 is built on a sacrificial layer which later becomes a released substrate to form a free-standing thin-film resonator. In other examples, the BAW resonator 102 is built on one or more acoustic reflectors to form a solidly mounted resonator.

To retain acoustic energy in the BAW resonator 102, the example piezoelectric layer 110 of FIG. 1 is formed to have an example convex surface 116. The example convex surface 116 is opposite the bottom surface 114. That is, in the illustrated example of FIG. 1, the piezoelectric layer 110 has a plano-convex shape (e.g., having a cross-section including a straight line and an outward bowed line opposite the straight line). The example convex surface 116 of FIG. 1 is formed to have a shape that reduces spurious modes, and confines at least some main mode acoustic energy in a central portion 118 of the piezoelectric layer 110. In some examples, confining main mode acoustic energy refers to confining a portion (e.g., a majority) of main mode acoustic energy. By confining main mode acoustic energy in the central portion 118, less acoustic energy leaks out from the BAW resonator 102 to inactive region(s) of the BAW resonator 102, and/or the substrate 128, thereby increasing the Q of the BAW resonator 102, and, in turn, the performance of a system including the example BAW 102 and/or the example IC package 100. Example manufacturing processes that may be carried out to form the convex surface 116 are described below in connection with FIGS. 3A-3E.

As shown in FIG. 1, another example electrode 120 is disposed on (e.g., formed on), at least, the convex surface 116 of the piezoelectric layer 110. As shown, the electrodes 112 and 120 need not have the same dimensions as the piezoelectric layer 110 or each other, and may have different dimensions in different directions. In some examples, the example electrodes 112 and 120 are formed of a conductive material compatible with a CMOS manufacturing process. The electrodes 112 and 120 may be electrically coupled with other components in the IC package 100 and/or external components. For example, the electrode 112, and the electrode 120 may be electrically coupled (shown conceptionally by a bone wire 122 in FIG. 1) to an IC 124 (e.g., a digital logic circuit, an analog circuit, a processor core, a digital signal processor (DSP) core, etc.) implemented in the IC package 100. In some examples, the IC 124 controls and/or uses a clock signal generated using the BAW resonator 102 to perform one or more functions (e.g., down conversion, up conversion, modulation, de-modulation, etc.). The IC 124 and/or one of the electrodes 112 and 120 may be electrically coupled to an external contact 106, as shown conceptually in FIG. 1 with a bond wire 126. In the example of FIG. 1, the bottom planar electrode 112 is disposed on (e.g., deposited on, formed on, etc.) an example substrate (e.g., a carrier wafer, etc.) 128. In some examples, the IC 124 is an IC die, and the BAW resonator 102 is a microelectromechanical system (MEMS) die.

In operation, when a voltage is applied between the electrode 120 on the top convex surface 116, and the electrode 112 on the bottom planar surface 114 of the piezoelectric layer 110, bulk acoustic waves of specific frequencies are generated within the piezoelectric layer 110, forming an electrical resonance response.

While an example manner of implementing the IC package 100 including a BAW resonator 102 having a convex surface 116 in accordance with this disclosure is illustrated in FIG. 1, one or more of the parts illustrated in FIG. 1 may be combined, divided, re-arranged, omitted, eliminated and/or implemented in any other way. Further, an IC package including a BAW resonator having a convex surface in accordance with this disclosure may include one or more parts in addition to, and/or instead of, those illustrated in FIG. 1, and/or may include more than one of any or all the illustrated parts. For example, acoustic reflectors may be included.

Figure 2:
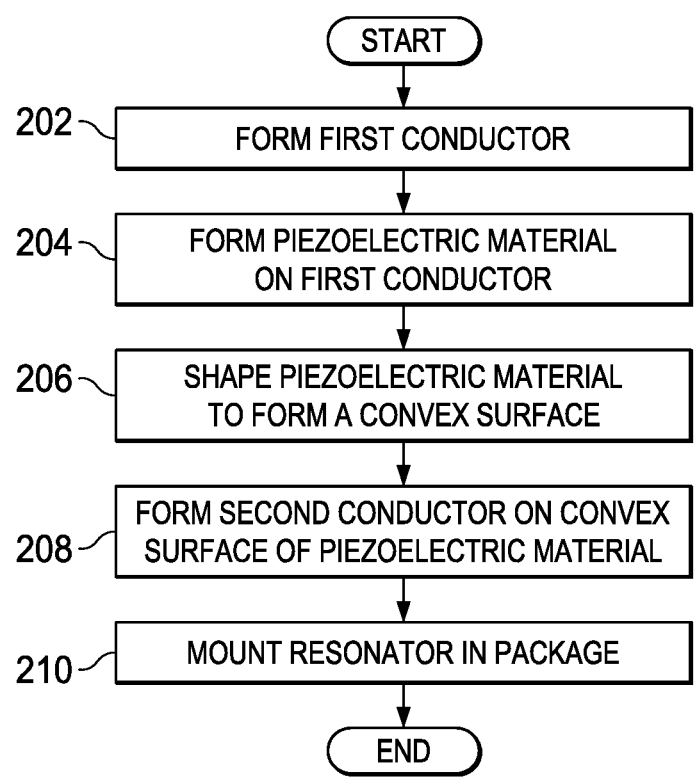
FIG. 2 is a flowchart representing example processes that may be implemented to form BAW resonators having convex surfaces, in accordance with this disclosure.

FIG. 2 is a flowchart representative of example processes that may be carried out to form a BAW resonator having a convex surface. In some examples, one or more processors or controllers that control one or more manufacturing machines or processes (e.g., a lithography process) to implement the example processes of FIG. 2 to form a BAW resonator having a convex surface, in accordance with this disclosure.

The example processes of FIG. 2 include forming a first conductor (e.g., the example electrode 112) on a substrate (e.g., the example substrate 128) (or an acoustic reflector, a sacrificial layer, etc.) (block 202), and forming a layer of piezoelectric material (e.g., the example piezoelectric layer 110) on the first conductor (block 204). As will be described below in connection with examples shown in FIGS. 3A-3E, the piezoelectric material is shaped to form a convex surface (e.g., the example convex surface 116) of a piezoelectric layer (e.g., the example piezoelectric layer 110) (block 206). A second conductor (e.g., the example electrode 120) is formed on the convex surface forming a BAW resonator (block 208). The BAW resonator is then integrated with other active IC (e.g., the example IC 124) and/or passive components, or by itself, and packaged in an IC package (e.g., the example package 100) (block 210).

FIGS. 3A-3E illustrate a non-limiting example method of forming a convex surface (e.g., the example convex surface 116) on the piezoelectric layer (e.g., the example piezoelectric layer 110) of a BAW resonator (e.g., the example BAW resonator 102). The example process of FIGS. 3A-3E can be carried out, for example, during the manufacture of a semiconductor IC using a CMOS manufacturing process. While an example method is shown in FIGS. 3A-3E, portions thereof may be combined, divided, re-arranged, omitted, eliminated and/or implemented in any other way. Moreover, other methods of forming a convex surface on a piezoelectric layer for a BAW resonator can be implemented. For ease of understanding, the reference numerals of FIG. 1 are used in FIGS. 3A-3E. Thus, the interested reader is referred to the descriptions of these referenced parts provided above in connection with FIG. 1.

Figure 3A:
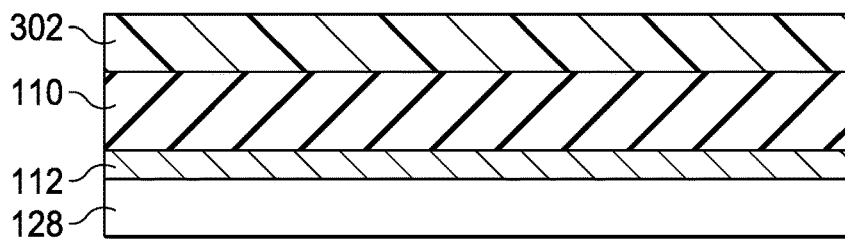
FIGS. 3A, 3B, 3C, 3D and 3E illustrate various stages of an example shaped lithography process for forming a convex piezoelectric surface.
Figure 3B:
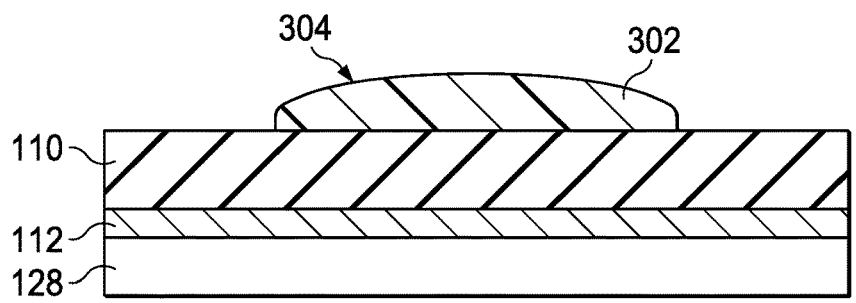

To shape the piezoelectric layer 110, a layer of photoresist 302 is formed on the piezoelectric layer 110 (see FIG. 3A). In some examples, the layer of photoresist 302 is patterned (e.g., shaped) to have a profile 304 (e.g., a shape) corresponding to the desired convex shape of the piezoelectric layer 110 (see FIG. 3B). However, the curvature of the photoresist may not be the same as the final desired convex surface of the piezoelectric layer, depending, for example, on etch rate, chemical reaction, etc. of the fabrication process. In some examples, the layer of photoresist 302 is patterned using a known process such as gray-scale lithography, although other process(es) may be used. In gray-scale lithography, light used to pattern the photoresist 302 passes through a mask having a pitch sufficiently small to create diffraction effects, thus, creating a shaped pattern of light. In the present example, the pattern of light has a shape corresponding to the desired shape of the convex surface 116.

Figure 3C:
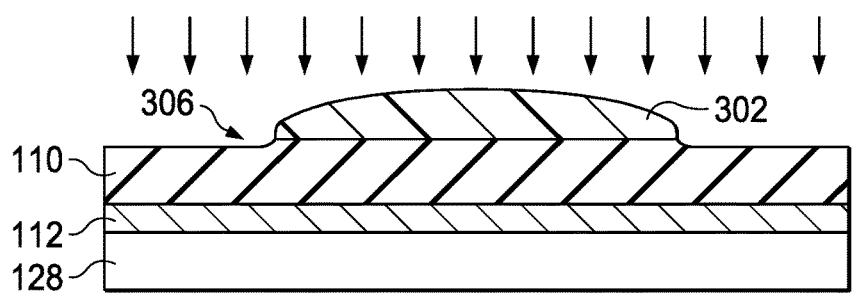
Figure 3D:
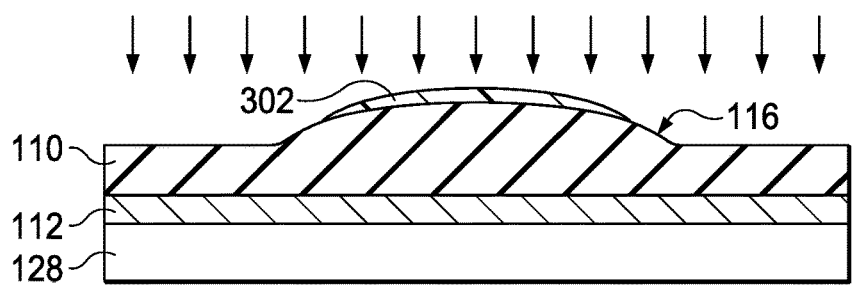
Figure 3E:
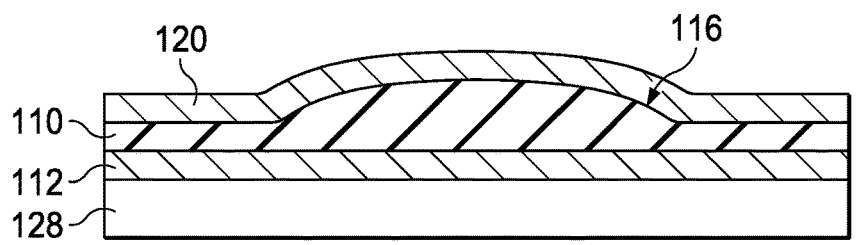

The piezoelectric layer 110 and the patterned photoresist 302 are exposed to an etching solution (signified with the downward arrows in FIGS. 3C and 3D) that, while in contact, continually removes piezoelectric material of the layer 110 and photoresist material 302. Starting at FIG. 3B, etching continually removes an upper layer portion 306 of the piezoelectric material 110, and continually reduces the thickness of the photoresist 302, as shown in FIG. 3C. As etching continues, the piezoelectric material 302 continues to thin at the edges and, as the photoresist 302 is continually etched away, continually exposes more of the convex surface 116 to etching, as shown in FIG. 3D. The etching of the photoresist 302 continually moves inward, thus, forming the convex surface 116. Finally, the conductor 120 is formed on the convex surface 116, as shown in FIG. 3E.

"Including" and "comprising" (and all forms and tenses thereof) are used herein to be open ended terms. Thus, whenever a claim lists anything following any form of "include" or "comprise" (e.g., comprises, includes, comprising, including, etc.), it is to be understood that additional elements, terms, etc. may be present without falling outside the scope of the corresponding claim. As used herein, when the phrase "at least" is used as the transition term in a preamble of a claim, it is open-ended in the same manner as the term "comprising" and "including" are open ended. Conjunctions such as "and," "or," and "and/or" are inclusive unless the context clearly dictates otherwise. For example, "A and/or B" includes A alone, B alone, and A with B. In this specification and the appended claims, the singular forms "a," "an" and "the" do not exclude the plural reference unless the context clearly dictates otherwise.

Any references, including publications, patent applications, and patents, cited herein are hereby incorporated by reference to the same extent as if each reference were individually and specifically indicated to be incorporated by reference and were set forth in its entirety herein.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A bulk acoustic wave (BAW) resonator comprising:
a substrate configured to have a first planar surface and a second planar surface, the second planar surface opposite the first planar surface, the first planar surface configured to be disposed on an integrated circuit;
a first electrode configured to have a third planar surface, a fourth planar surface, a first planar surface end, and a second planar surface end, the third planar surface opposite the fourth planar surface, the third planar surface spanning between the first planar surface end and the second planar surface end, wherein the third planar surface, the first planar surface end, and the second planar surface end are configured to be disposed on the second planar surface of the substrate;
a piezoelectric layer disposed on the first electrode, the piezoelectric layer having a convex surface; and
a second electrode disposed on the convex surface.

2. The BAW resonator of claim 1, wherein the convex surface reduces a spurious mode and confines a main mode in a central portion of the BAW resonator.

3. The BAW resonator of claim 1, wherein the piezoelectric layer has a planar surface opposite the convex surface.

4. The BAW resonator of claim 1, wherein the substrate is configured to support the BAW resonator.

5. The BAW resonator of claim 1, wherein the piezoelectric layer includes a thin film of at least one of aluminum nitride or zinc oxide.

6. The BAW resonator of claim 1, wherein the convex surface reduces a leakage of acoustic energy out from the BAW resonator.

7. The BAW resonator of claim 6, wherein the reduction of the leakage of the acoustic energy increases a quality factor of the BAW resonator.

8. An integrated circuit (IC) package comprising:
a bulk acoustic wave (BAW) resonator disposed in the package, the BAW resonator including:
a substrate configured to have a first planar surface and a second planar surface, the second planar surface opposite the first planar surface, the first planar surface configured to be disposed on an integrated circuit;
an electrode configured to have a third planar surface, a fourth planar surface, a first planar surface end, and a second planar surface end, the third planar surface opposite the fourth planar surface, the third planar surface spanning between the first planar surface end and the second planar surface end, wherein the third planar surface, the first planar surface end, and the second planar surface end are configured to be disposed on the second planar surface of the substrate; and
a piezoelectric layer disposed on the fourth planar surface of the electrode, the piezoelectric layer having a convex surface.

9. The IC package of claim 8, wherein the BAW resonator is a thin-film BAW resonator.

10. The IC package of claim 8, the convex surface formed using at least one of shaped lithography, or gray-scale lithography.

11. The IC package of claim 8, wherein the substrate is to support the BAW resonator.

12. The IC package of claim 8, wherein the piezoelectric layer includes aluminum nitride.

13. The IC package of claim 8, wherein the piezoelectric layer is plano-convex.

* * * * *